United States Patent [19]

Young

[11] Patent Number: 5,798,534

[45] Date of Patent: Aug. 25, 1998

[54] MANUFACTURE OF ELECTRONIC DEVICES COMPRISING THIN-FILM CIRCUITRY

[75] Inventor: Nigel D. Young, Redhill, England

[73] Assignee: U.S. Philips Corporation, New York, N.Y.

[21] Appl. No.: 512,429

[22] Filed: Aug. 8, 1995

[30] Foreign Application Priority Data

Aug. 20, 1994 [GB] United Kingdom ............... 9416899

[51] Int. Cl.⁶ ............................................ H01L 29/04
[52] U.S. Cl. .................... 257/59; 247/347; 247/360; 247/409; 247/529; 438/30; 438/155; 438/281; 438/292; 438/601
[58] Field of Search ................... 257/57, 59, 203, 257/347, 355, 356, 360, 365, 409, 529; 438/30, 155, 281, 292, 601

[56] References Cited

U.S. PATENT DOCUMENTS

| | | | |
|---|---|---|---|
| 5,019,001 | 5/1991 | Abe et al. | 438/30 |
| 5,019,002 | 5/1991 | Holmbey | 257/355 |
| 5,130,829 | 7/1992 | Shannon . | |
| 5,220,443 | 6/1993 | Hoguchi | 257/356 |
| 5,373,377 | 12/1994 | Ogawa et al. | 257/356 |
| 5,384,266 | 1/1995 | Chapman . | |
| 5,448,095 | 9/1995 | Hennessy et al. | 257/355 |
| 5,486,716 | 1/1996 | Saito et al. | 257/360 |
| 5,497,146 | 3/1996 | Hebiguchi | 257/59 |
| 5,504,348 | 4/1996 | Yoshida et al. | 257/59 |

FOREIGN PATENT DOCUMENTS

| | | | |
|---|---|---|---|
| 0589519 | 3/1994 | European Pat. Off. . | |
| 60-251665 | 12/1985 | Japan | 257/59 |
| 4-130668 | 5/1992 | Japan | 257/59 |
| 5181157 | 7/1993 | Japan . | |

Primary Examiner—J. Carroll
Attorney, Agent, or Firm—Brian J. Wieghaus

[57] ABSTRACT

In the manufacture of liquid-crystal display devices and other large-area electronics devices, electrostatic discharge damage (ESD) of tracks and other thin-film circuit elements can result during ion implantation and/or during handling. This damage is avoided by connecting the thin-film circuitry in a charge leakage path with gateable TFT links (45). These links (45) are TFTs (45) with a common gate line (7) for applying a gate bias voltage to control current flow through the links, e.g to turn off the TFTs (45) during testing of the device circuit. In accordance with the present invention the gateable links (45) in the leakage path are removed simultaneously by applying a sufficiently high gate bias (Vg2) to the common gate line (7) to break the links (45) by evaporating at least the channel regions (6) of the TFTs. A suitable thin-film structure is chosen for the TFTs (45) to facilitate evaporating their channel regions (6) in this manner. The TFTs (45) may have a very thin gate dielectric layer (8), and a channel region (6) which is narrowed in the area of overlap with the gate (7). An over-layer 44 may protect the device circuitry from debris resulting from the blowing the links (45). This protective layer (44) may have windows (42) which expose the gateable links (45).

12 Claims, 5 Drawing Sheets

MANUFACTURE OF ELECTRONIC DEVICES COMPRISING THIN-FILM CIRCUITRY

BACKGROUND OF THE INVENTION

This invention relates to methods of manufacturing an electronic device having on an insulating substrate a plurality of thin-film circuit elements including a group of thin-film connection tracks. The invention relates particularly to protecting the circuit elements against a damaging electrostatic discharge (ESD). The invention also relates to electronic devices manufactured by such methods, and to electronic devices having such protection means. The device may be, for example, an active-matrix liquid-crystal display or other flat panel display, or any other type of large area electronic device with thin-film circuit elements, for example, a thin-film data store or an image sensor.

It is known from published Japanese Patent Application Kokai JP-A-05-181157 to protect against ESD by forming a group of thin-film transistors on the insulating substrate together with the thin-film circuit elements. Each of the transistors has a channel region which provides a gateable link to a respective thin-film track of the group of tracks for connecting that thin-film track in a charge leakage path. This leakage path serves for protecting the circuit elements against a damaging electrostatic discharge (ESD) during a stage in the manufacture of the device. The group of transistors have a common gate line for applying a gate bias voltage for controlling current flow through the channel regions of the transistors.

Depletion-mode thin-film field-effect transistors (TFTs) are used to form the gateable links in the liquid-crystal display device disclosed in JP-A-05-181157. These transistors are formed between a peripheral short-circuit ring and the ends of scan lines and signal lines of the device. When no voltage is applied to the common gate line, these depletion-mode transistors are in a conducting state and so permit leakage of electrostatic charge between the scan and signal lines and the short-circuit ring. When a negative voltage is applied to the common gate line, these depletion-mode transistors having an n+ channel are switched into a high resistance state, so isolating the scan and signal lines from the short-circuit ring. In this isolated condition, test signals can be applied to the thin-film conductor lines for testing the thin-film circuit. When the manufacture is complete, the short-circuit ring can be removed by, for example, scribing adjacent to the periphery of the device substrate.

SUMMARY OF THE INVENTION

It is an aim of the present invention to provide ESD protection using an electrostatic charge leakage path with gateable links, while avoiding the need to remove part of the path (for example, a short-circuit ring) by scribing or by any similar operation.

According to a first aspect of the present invention there is provided a method of manufacturing an electronic device having on an insulating substrate a plurality of thin-film circuit elements including a group of thin-film connection tracks, which method includes forming a group of thin-film transistors on the substrate in such an arrangement with the thin-film circuit elements that a channel region of a respective transistor provides a gateable link to a respective thin-film track of the group of tracks for connecting that thin-film track in a charge leakage path, which leakage path serves for protecting the circuit elements against a damaging electrostatic discharge, the group of transistors being provided with a common gate line for applying a gate bias voltage to control current flow through the channel regions of the transistors. In accordance with the present invention, such a method is characterised in that the gateable links in the leakage path to all the thin-film tracks of the group are broken simultaneously by applying a sufficiently high gate bias to the common gate line to break the links by evaporating at least the channel regions of the transistors, after the leakage path has served for electrostatic discharge protection.

Thus, after providing ESD protection, all the gateable links of the group are removed simultaneously in a simple manner by the application of a high gate bias to their common gate line. The links may be blown electrically like a fuse, the current flow being between their individual channel regions and their common gate line. A permanent open-circuit break can thus be formed in the channel region of each transistor link.

In this context, it should be noted that the present inventor has previously proposed using thin-film links of, for example, aluminium or a metal silicide to provide ESD protection between thin-film tracks, and then blowing these thin-film links (like a fuse) to break the ESD protection path. This fusible link technology is described in published European patent application EP-A-0 589 519 (our ref: PHB 33819), the whole contents of which are hereby incorporated as reference material. In this case, the links are blown by applying individual pulses sequentially between successive pairs of tracks. Thus, all the links cannot be evaporated simultaneously. Furthermore, the links are not gateable, and so a temporary circuit isolation of the tracks is not achievable. Thus, the device circuit of EP-A-0 589 519 cannot be tested before individually blowing each pair of links.

The links in accordance with the present invention are both blowable and gateable, using different bias voltage levels on their common gate line. With a low gate bias, temporary circuit isolation is achievable to permit testing of the device circuit. When a sufficiently high gate bias is applied to the common gate line, the transistor structure breaks down and a sufficiently large current may pass between the gate line and the channel regions of these transistors as to evaporate and break these gateable links by Joule heating. For breakdown, the thin-film structure of each thin-film transistor can be especially constructed in various ways, in the area of its channel region and the common gate line. Particular examples (such as a thin gate dielectric and narrow channel region) are described below.

Thin-film field-effect transistors (common termed "TFTs") of either the enhancement or depletion mode type may be used to provide the gateable links which are breakable by high gate bias in accordance with the present invention.

Gateable link transistors in accordance with the present invention may be formed not only at the ends of thin-film connection tracks but also between the thin-film connection tracks. Either the device manufacturer or the customer may apply the high voltage to the common gate line to break these gateable links. Accordingly, the links may be removed by the device manufacturer before sale of the device, or they may be removed by the customer who would complete the manufacture of the device.

Thus, according to a second aspect of the present invention there is provided an electronic device having on an insulating substrate a plurality of thin-film circuit elements including a group of thin-film connection tracks, a group of thin-film transistors on the substrate in such an arrangement with the thin-film circuit elements that a channel region of a respective transistor provides a gateable link to a respective thin-film track of the group of tracks for connecting that thin-film track in a charge leakage path, which leakage path serves for protecting the circuit elements against a damaging electrostatic discharge, the group of transistors being provided with a common gate line for applying a gate bias voltage to control current flow through the channel regions of the transistors.

In accordance with the present invention such a device is characterised in that each thin-film transistor of the group is constructed, in the area of its channel region and the common gate line, with a thin-film structure suitable for rendering the transistor open-circuit by evaporation of its channel region by the application of a sufficiently high gate bias voltage to the common gate line. Examples of such structures are described below and also with reference to the drawings. The gateable links in the leakage path to all the thin-film tracks of the group are broken simultaneously by applying the high gate bias voltage to the common gate line, after the leakage path has served for electrostatic discharge protection. As described above, the breaking of the gateable links may be done by either the device manufacturer prior to sale or by the customer.

Preferably a protective over-layer is formed over the thin-film circuit elements and thin-film connection tracks, before applying the high gate bias voltage to the common gate line. This protective over-layer serves to mask the thin-film circuit elements and thin-film connection tracks against any debris from the gateable links when so broken. The protective layer may have windows which expose the thin-film structure of the gateable-link transistors at the area of their channel regions. These windows may permit the thin-film structure of these transistors to be blown away more readily in this area by the application of the high gate bias voltage. However, such windows need not be provided when a very high degree of heating results (due to the particular thin-film construction adopted) on applying the high gate bias.

To enhance the desired breakdown and heating effects, a variety of thin-film construction features may be adopted for the gateable-link transistors in the area of their channel regions and the common gate line, in addition to (or instead of) constructional features relating to any protective over-layer. Thus, for example, the constructional features are preferably designed to increase the electric field intensity of the gateable link transistor structure with high gate bias, and/or to exploit weaknesses occurring in the gate dielectric of the gateable link transistor structure, and/or to increase the electrical resistance (and hence Joule heating) of the breakdown current path in and through the channel region to the gate line, and/or to reduce the thermal mass which is to be heated and evaporated. By these means, high current densities and high temperatures can be obtained locally in the gateable link transistor structures when the high gate bias is applied. Local heating to very high temperatures can occur. As a result, the gateable link transistors can be totally evaporated across the whole width of their channel regions, at least locally along the leakage path.

The channel region of the transistor may be provided by a semiconductor thin-film pattern having a width which is narrowed in the vicinity of (or in overlap with) the common gate line. By shaping the channel region in this manner in or near the area of overlap, its thermal mass is reduced, and a higher electrical resistance and higher field concentration can be obtained in this area when the high gate bias is applied. Hence a more intense local heating effect can occur. Furthermore, there is less channel region material which needs to be evaporated to break the gateable link.

The thin-film circuit elements of the device may include transistors in a device circuit. The transistors of the gateable links may be formed using at least some (possibly even all) of the thin-film processing steps which are used for forming the transistors in the device circuit. Thus, a large number of extra processing steps for forming the gateable-link transistors can be avoided.

A common semiconductor thin film may be patterned to provide channel regions of the transistors in the device circuit and the channel regions of the transistors of the gateable links. The widths of the channel regions of the transistors in the device circuit are chosen in the normal manner in accordance with the desired circuit characteristics for each of these transistors. In most cases, these transistors in the device circuit may have a channel region which is wider than a narrow channel region of the gateable link transistors. This merely involves modifying the mask layout for forming the channel regions of the various transistors, both as regards its pattern and dimensions.

A gate dielectric of the transistors of the gateable links may be provided by a thin insulating thin-film pattern which has a smaller thickness than a thicker insulating thin-film pattern which provides a gate dielectric of the transistors in the device circuit. This thin dielectric may be a separately deposited thin film. However, the thin dielectric may be formed quite simply by etching so as to thin the thicker insulating thin film in the areas of the gateable links. The thin gate dielectric of the gateable-link transistors permits the breakdown of these transistors to occur with the application of a moderately high gate bias voltage. The use of etching to thin the insulating film may enhance local defects in the film, so facilitating the breakdown. The gate line may be present either above or below the thin gate dielectric.

The gateable-link transistors in accordance with the present invention may connect the group of the thin-film tracks to a peripheral short-circuit track to form the leakage path. The thin-film transistors of gateable links in accordance with the present invention may be interleaved with the thin-film connection tracks in the charge leakage path. The common gate line may extend transverse to the longitudinal direction of the thin-film connection tracks and may be insulated from these tracks by an insulating thin-film pattern which has a larger thickness than an insulating thin-film pattern which provides a gate dielectric of the transistors of the gateable links.

BRIEF DESCRIPTION OF THE DRAWINGS

These and other features in accordance with the present invention and their advantages, are illustrated specifically in embodiments of the invention now to be described, by way of example, with reference to the accompany diagrammatic drawings. In these drawings:

FIGS. 4 to 6 are cross-sectional views of the structures of FIG. 2, at other stages in the manufacture, of which FIG. 6 shows only the structure A when the gateable link is blown open-circuit by the application of a high gate bias;

Figure 1:
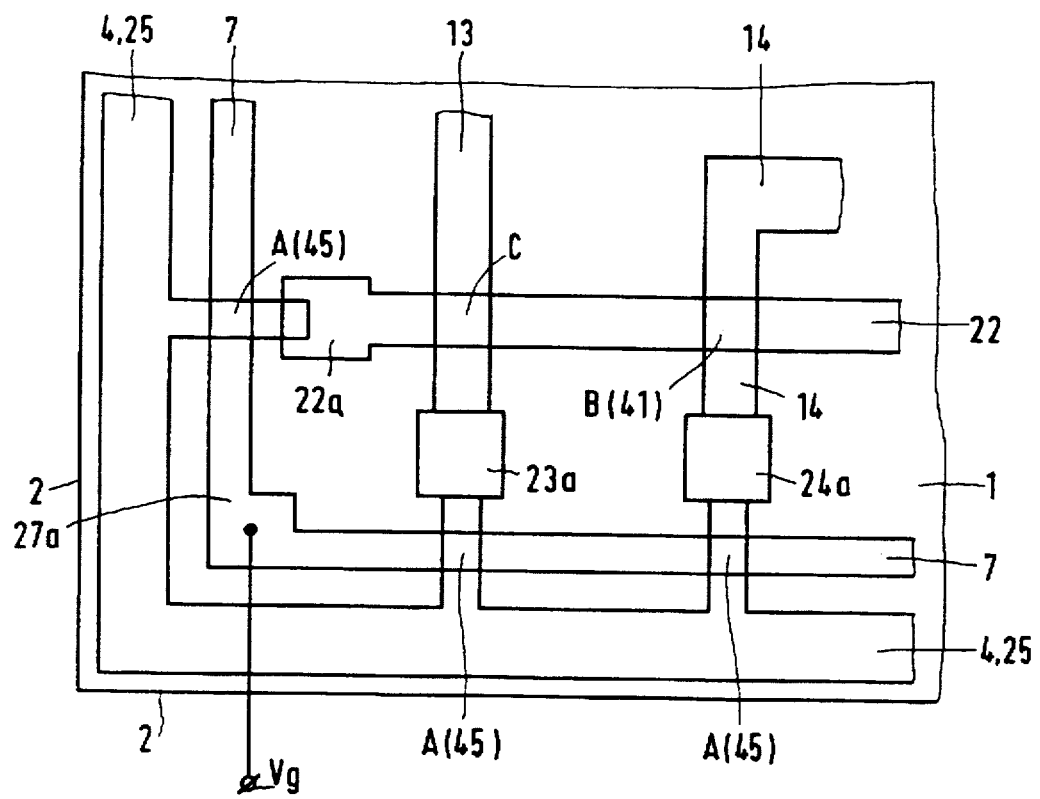
FIG. 1 is a plan view of part of an electronic device having ESD protection links, and shown towards the final stage of its manufacture by a method in accordance with the present invention.
Figure 3:
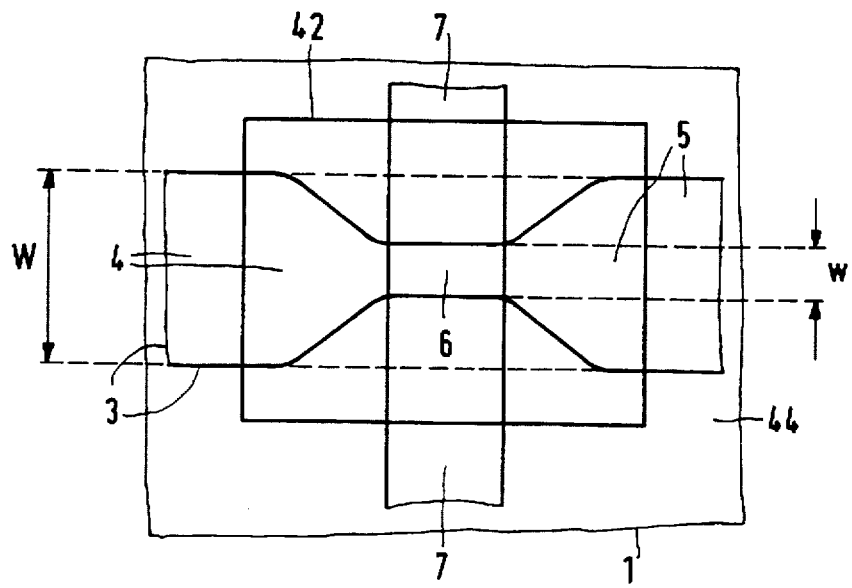
FIG. 3 is a plan view of an example of the gateable link structure A of FIG. 2.
Figure 7:
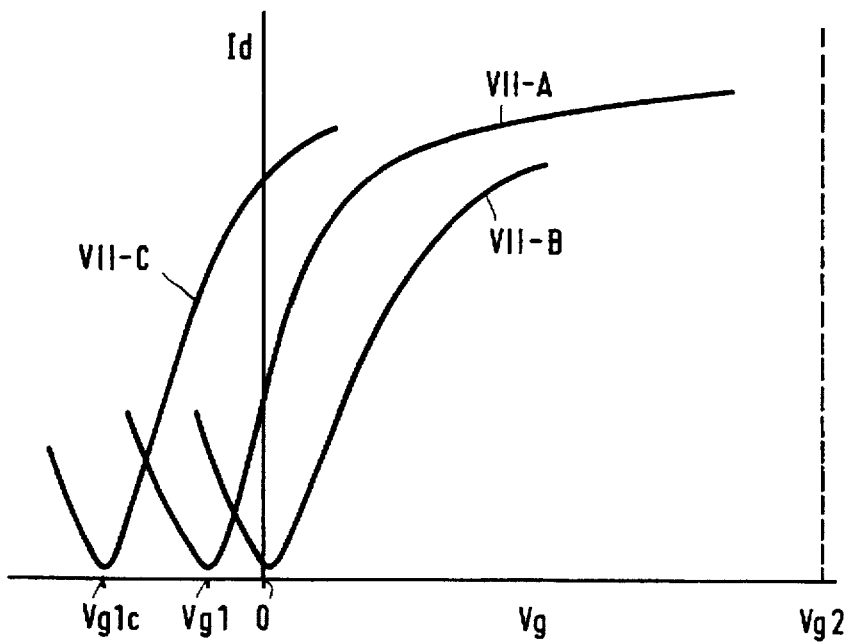
Figure 8:
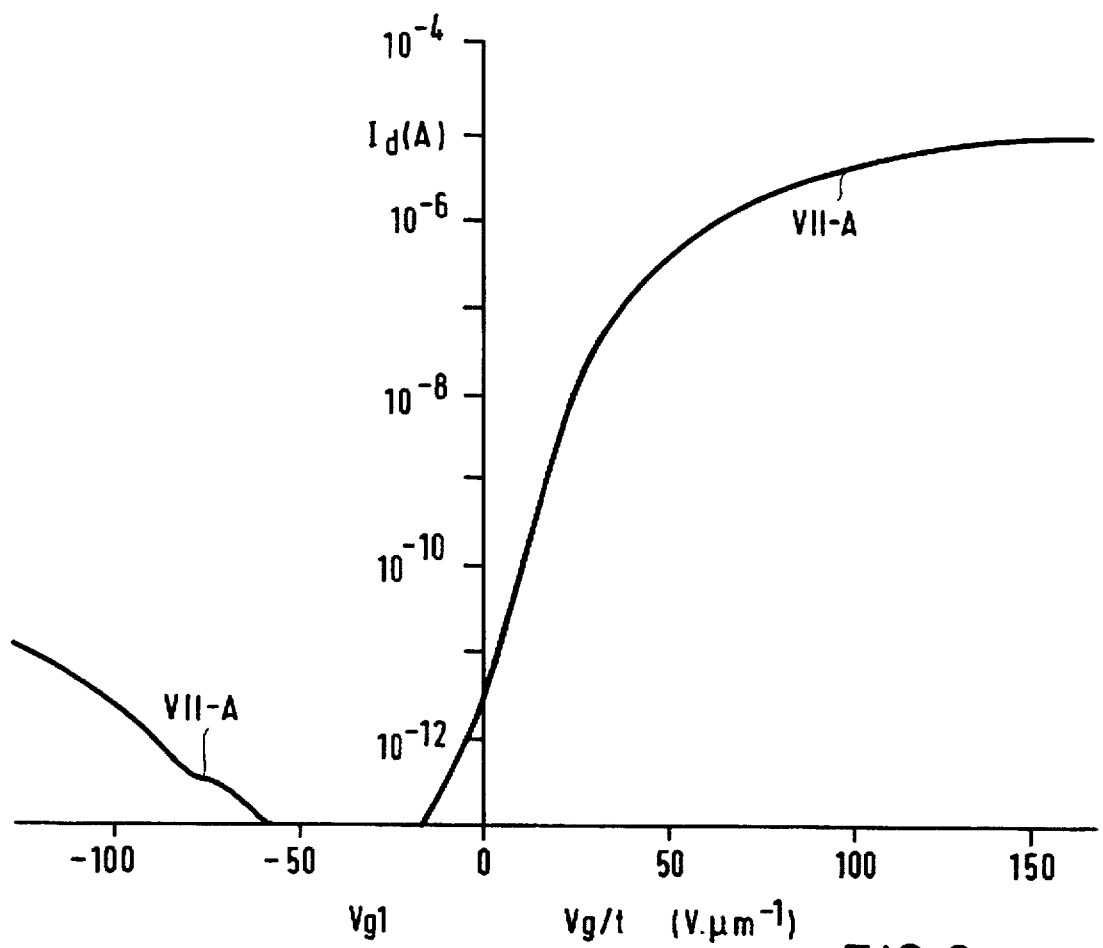
Figure 9:
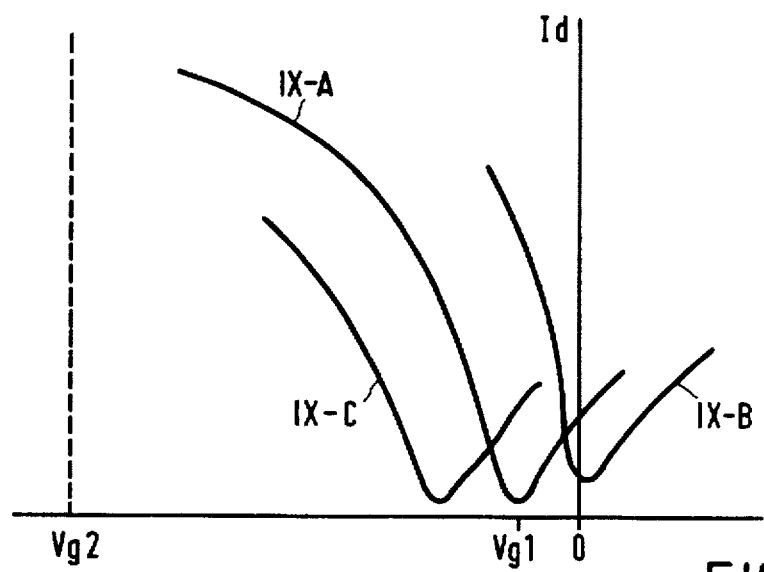
Figure 10:
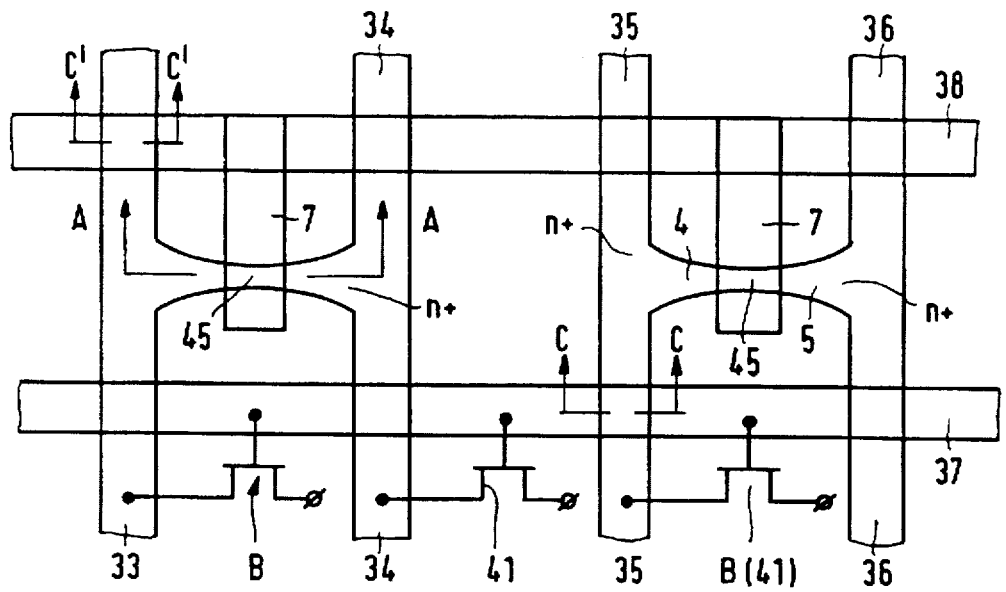
Figure 11:
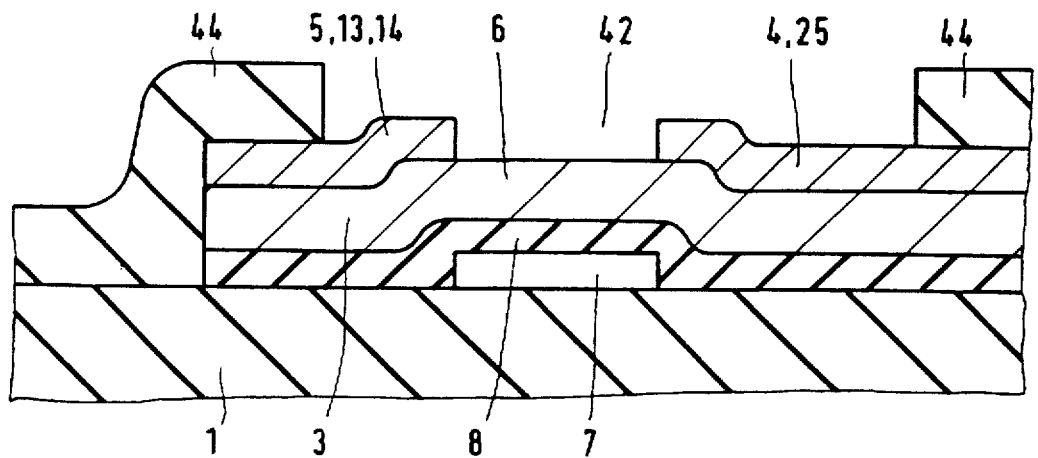

FIGS. 7 to 9 are plots of the drain-current gate-voltage characteristics (Id.Vg) of typical gateable links for ESD protection of devices in accordance with the present invention;

FIG. 10 is a plan view of an electronic device in accordance with the present invention, having such gateable links between thin-film connection tracks of the device; and FIG. 11 is a cross-sectional view of an example of another thin-film structure of a gateable link in accordance with the present invention and which may include layout features similar to those illustrated in the plan views of FIGS. 1, 3 and 10.

It should be noted that all the drawings, except the characteristic of FIG. 8, are diagrammatic and not drawn to scale. Relative dimensions and proportions of parts of these FIGS. 1 to 7 and 9 to 11 have been shown exaggerated or reduced in size for the sake of clarity and convenience in the drawings. The same reference signs are generally used to refer to corresponding or similar features in the different embodiments.

DETAILED DESCRIPTION OF THE PREFERRED EMBODIMENTS

The present invention may be used in the manufacture of a wide variety of large-area electronics devices comprising thin-film circuit elements formed on an insulating substrate 1. The device (of which FIG. 1 illustrates only a corner part) may be, for example, an active matrix liquid crystal display, for example, as in JP-A-05-181157. Examples of such a display are disclosed in U.S. Pat. No. 5,103,829 (Our ref PHB 33646) and in U.S. patent application Ser. No. 160,990 filed 3rd Dec. 1993 (published European patent application EP-A-0 601 652; our ref PHB 33824). Thus, the substrate 1 may be an inexpensive glass providing a back-plane of the display and carrying a matrix of pixel switching elements (for example thin-film transistors) and associated driving circuitry (also comprising thin-film transistors) for the matrix. These thin-film transistors (TFTs) in the device circuit are designated by reference 41 in the Figures. The individual circuit elements and connections of the matrix circuit and the associated circuitry may be formed in known manner, by depositing on the substrate 1 a succession of films of various materials (for example, conductors, insulators, semiconductors, semi-insulators). These films are processed (for example, by etching and doping) to form the various regions and patterns of the thin-film transistors and other circuit elements, including their thin-film connection tracks. FIG. 1 does not illustrate any circuit configuration of the TFTs 41 in the matrix and the associated driving circuitry, because these may be in any of a variety of known forms, for example as described and illustrated in U.S. Pat. No. 5,130,829 and EP-A-0 601 652. The whole contents of U.S. Pat. No. 5,130,829 and EP-A-0 601 652 (and its US counterpart) are hereby incorporated herein as reference material.

Instead of being an active matrix flat panel display, the device of FIG. 1 may be designed for a quite different function, for example an image sensor having a matrix of switching transistors 41 which serve for addressing an array of thin-film image sensing elements (for example, photodiodes) and which are driven by associated TFT circuitry. In another form, the electronic device of FIG. 1 may be a data store comprising a switching matrix of TFTs 41 which serve for addressing an array of storage devices, for example thin-film capacitors.

The thin-film circuitry on the substrate 1 comprises various groups of thin-film connection tracks. FIG. 1 illustrates by way of example a group of three connection tracks 22,13,14 which extend outwards towards a periphery 2 of the substrate 1. In a particular example, the conductor track 22 may be of a metal such as aluminium, whereas the conductor tracks 13,14 may comprise highly-doped conductive polycrystalline silicon. Near its end towards the periphery 2, the metal track 22 is expanded to form a contact pad 22a to which an external wire (or other type of external connection) may be bonded. Near their ends towards the perimeter 2, the polycrystalline silicon tracks 13 and 14 may be provided with similarly large metal contact pads 23a and 24a to which external connections may be bonded.

In the absence of an electrostatic charge leakage path provided in accordance with the present invention, electrostatic charge may build up and damage the thin-film circuit elements. As described in EP-A-0 601 652, the charge build-up may occur during an ion implantation stage in the manufacture, for example as illustrated in the present FIG. 5. However, it may occur as static electricity during handling of the device. Such charge build-up can cause a damaging discharge between the conductor patterns 22,13,14, etc, and so it can cause a breakdown of parts of the circuit elements, for example the gate dielectric film 18 of the TFTs 41.

In order to avoid damage by electrostatic discharge (ESD) a group of thin-film transistors 45 are formed on the substrate together with the thin-film circuit elements (e.g TFTs 41) of the device. Each transistor 45 has a channel region 6 which provides a gateable link to a respective thin-film track 22,13,14, for connecting that track in a charge leakage path, for example to a peripheral short-circuit ring 4,25. At some of the ESD critical stages in the manufacture (e.g the ion implantation stage of FIG. 5), the ring 4,25 may be earthed in known manner. The group of link transistors 45 have a common gate line 7 for controlling the current flow through the channel regions 6 of the transistors 45. The gate line 7 permits the device circuit to be tested before the links 45 are broken.

In accordance with the present invention each of these link transistors 45 is constructed, in the area of its channel region 6 and the common gate line 7, with a thin-film structure suitable for rendering the transistor 45 open-circuit by evaporating the channel region 6. This final and permanent open-circuit condition is achieved by the application of a sufficiently high gate bias Vg2 to the common gate line 7. The gateable lines 45 to all the thin-film tracks 22,13,14 . . . of the group are broken simultaneously by applying the high voltage Vg2 in this manner. This operation may be carried out by the device manufacturer before sale of the device. Alternatively, it may be carried out by the customer before assembling the device in a system. The common gate line 7 for blowing the links 45 is independent of other circuit connections in the device (including being independent of the contact pads 22a to 24a, and independent of connections and interconnections to the gates 17 of circuit TFTs 41 of the device). A large contact pad 27a of the gate line 7 may be left exposed in the device as sold to the customer, so as to permit the customer to apply the bias Vg2 to the gate line 7 and thereby to blow the links 45.

The manufacture of such a device will now be described with reference to FIGS. 2 to 8. In the cross-sections of FIGS. 2, 4 and 5, section A illustrates the area of a gateable link transistor 45, section B illustrates the area of a thin-film transistor 41 in the device circuit, and section C illustrates a cross-over between two conductor tracks 22 and 13. A specific example of a gateable link transistor 45 which is blowable in accordance with the present invention is illustrated in the plan view of FIG. 3 and the cross-sectional view of FIG. 6.

Figure 4:
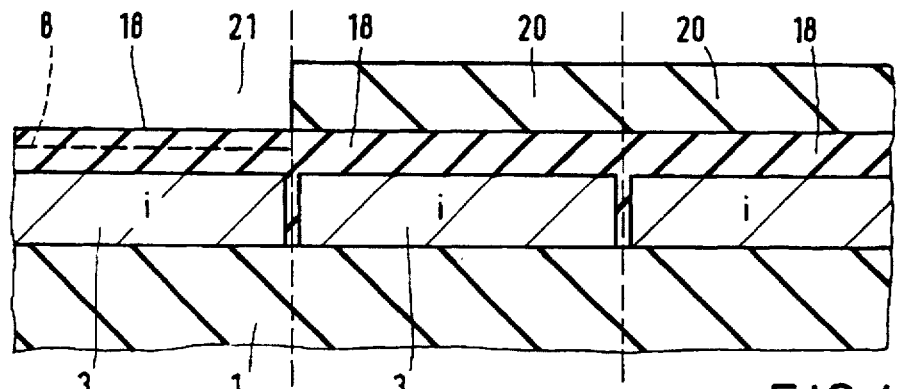

The TFTs 41 and 45 illustrated in FIGS. 2 to 6, are of the so-called "co-planar non-inverted" type. In this type of TFT, the gate electrode 7,17 is formed on a gate-dielectric layer 8,18 on a semiconductor film 3 which provides the channel regions 6,16 of the TFTs 45 and 41. The film pattern 3 also comprises source and drain regions 4,5,14,15 of the TFTs. FIG. 4 illustrates an early stage in the manufacture in which the thin-film structure comprises an insulating film 18 on the semiconductor pattern 3 on the insulating substrate 1.

The semiconductor pattern 3 comprises the individual bodies for the TFTs 41 and 45 (e.g see that of TFT 45 in FIG. 3) and individual connection tracks (e.g see tracks 13,14,4 in FIG. 1). This thin-film semiconductor pattern 3 may be of, for example, polycrystalline silicon. Its thickness may be, for example, about 0.1 μm (micrometers). As is illustrated in FIGS. 1 and 3, the semiconductor pattern 3 may have a width which is narrowed in the vicinity of where the common gate line 7 is to be provided in each gateable link TFT 45. Thus, although the semiconductor pattern 3 provides the channel regions 6 of the gateable link TFTs 45 and the channel regions 16 of the TFTs 41 in the device circuit, the channel regions 16 of the TFTs 41 have a width which is wider than a narrow width w of the channel regions 6 of the TFTs in the gateable links 5.

FIG. 3 illustrates a progressive narrowing of the semiconductor pattern of TFT 45 from W at its source and drain regions 4 and 5 to w at its channel region 6. Typical dimensions are, for example, about 5 μm for w and about 10 μm for W. The width of the channel regions 16 of the device TFTs 41 may be of the same order of magnitude as W or wider, the precise dimension depending on the current carrying capability of the TFT.

The dielectric film 18 in FIG. 4 may be of, for example, a silicon oxide. However, other insulating materials (e.g silicon nitride) and combinations of materials may be used instead. It may be formed on the semiconductor pattern 3 by a chemical vapour deposition process. The film 18 may typically have a thickness of, for example, 0.15 μm. The film 18 in this thickness provides the gate dielectric for the device TFTs 41 as illustrated in section B of FIGS. 2 to 5. The gate dielectric 8 of the gateable link TFTs 45 is provided by a thinner insulating thin-film pattern 8. In the embodiment illustrated in FIG. 4, this thinner dielectric film 8 is formed by locally etching an area of the dielectric film 18. Thus, the dielectric film 18 is deposited in areas A where the gateable links 45 are to be formed, as well as in areas (such as B and C) where the device circuit is to be formed. A masking pattern 20 (for example of photoresist) is formed on the deposited film 18. The masking pattern 20 has windows 21 over the areas A where the gateable links 45 are being formed. At these windows 21 the dielectric film 18 is then etched to the smaller thickness required for the gate dielectric 8. For this purpose, the masked structure may be immersed in a chemical etchant solution. The etching time is not as critical as would be the case if the treatment were being used to form the gate dielectric of a TFT 41 of the device circuit. Thus, the thinned gate dielectric 8 is only used subsequently in two ways, namely:

(i) with a low gate voltage Vg1 applied for temporarily turning off the TFT 45 when testing the device, and (ii) with the very high voltage Vg2 applied when breaking the TFT link 45.

Thus, the thickness of the thinned dielectric layer 8 is not critical. In a typical case it may be, for example, about 0.05 μm.

Figure 5:
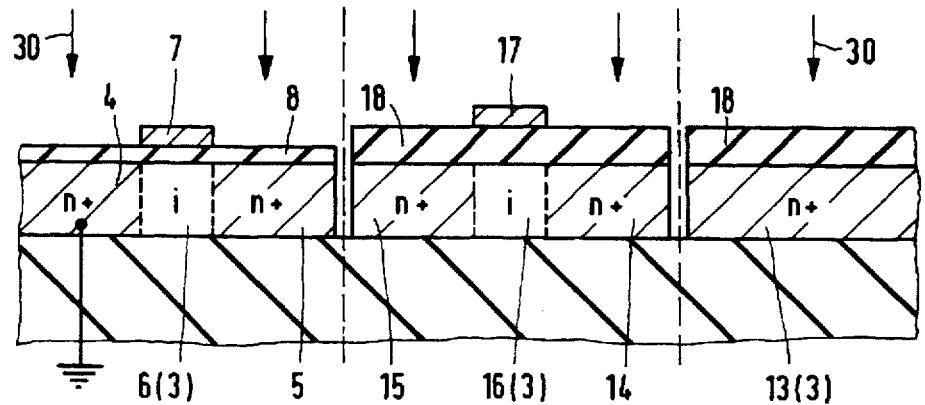

The masking pattern 20 is removed after the etching stage of FIG. 4. A further thin-film pattern (for example of polycrystalline silicon) is then deposited and etched to provide the gate lines 7,17 of the TFTs 41 and 45. FIG. 5 illustrates the resulting structure, at a subsequent ion-implantation stage in the manufacture. Thus, as illustrated in FIG. 5, dopant ions 30 may be implanted in the semiconductor pattern 3,7,17 to provide the highly doped source, drain and gate regions 4,5,7 of TFTs 45 and 14,15,17 of TFTs 41. The gate pattern 7,17 masks the underlying channel regions 6,16 in known manner against this dopant ion implantation. Thus, in this embodiment, the channel regions 6 and 16 of the TFTs 45 and 41 are of substantially intrinsic conductivity.

A further dielectric film 28 is then provided by chemical vapour deposition. This film 28 may also be of a silicon oxide. However, other insulating materials (e.g silicon nitride) and combinations of materials may be used instead. A typical thickness for the film 28 is, for example, 0.3 μm. A pattern of contact windows is then etched through the insulating films 28 and 18, for example where the source, drain and gate regions 4,5,7,14,15,17 are to be contacted. A conductive thin-film pattern (for example of a metal such as aluminium) is now deposited and etched to form interconnections such as the circuit track 22 and a peripheral track 25, and contact pads 22a,23a,24a,27a.

The electronic device is now tested with regard to satisfactory operation of its circuitry. In order to carry out this testing it is necessary to isolate the conductor tracks 22,13, 14, . . . from the short-circuit ring 4,25. This is carried out by applying a low gate bias voltage Vg1 to the common gate line 7 of the gateable link TFTs 45. The low voltage Vg1 is around the voltage minimum in the transistor characteristic of the TFT 45 as illustrated in FIGS. 7 and 8. In this way, the TFTs 45 are turned off for the circuit testing. If the device circuit fails the electrical testing, it may be possible for the device manufacturer to identify and to repair the cause of the failure.

Figure 2:
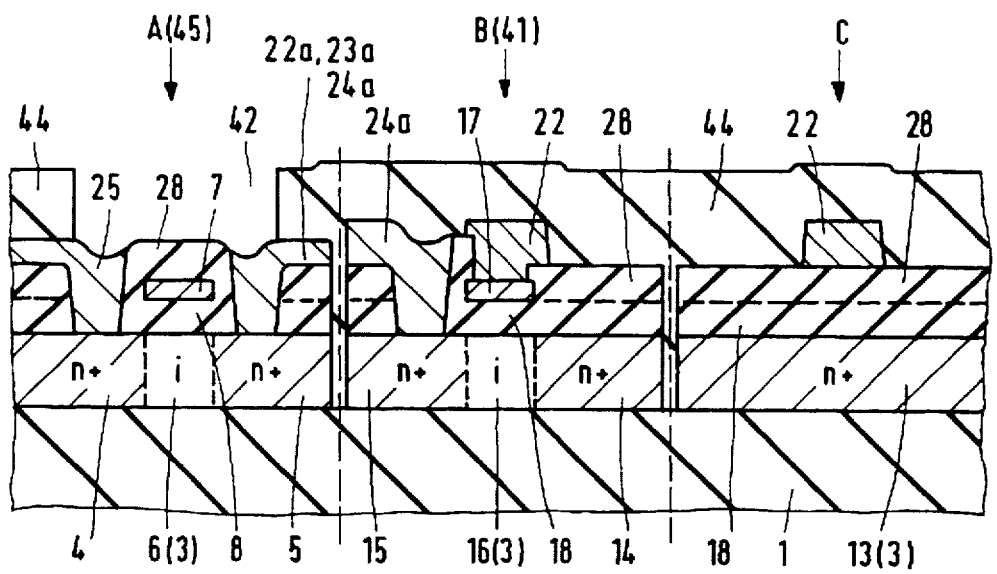
FIG. 2 is a cross-sectional view through specific examples of three thin-film structures A, B and C in the device of FIG. 1.

After successfully passing the circuit test, the manufacture of the device of FIGS. 1 and 2 is completed by removing the links 45. A protective layer 44 (for example of a polymer material) is formed over the thin-film circuit elements 41,22, . . . to mask these circuit elements against any debris from the gateable links 45 when these links 45 are blown. The protective layer 44 may have one or more windows 42 (see FIGS. 1 and 3) which expose the thin-film structure of the gateable-link transistors 45 at the area of their channel regions 6. These windows 42 may be formed in the same process stage as windows which expose the contact pads 22a,23a,24a to permit bonding of external connections in the final stage of manufacture or assembly of the device in a system. The contact pad windows may merge into a common window 42 over the common gate line 7 and over peripheral ring 4,25.

The gateable-link TFTs 45 are now blown by the application of the high gate bias Vg2, in accordance with the present invention. The bias Vg2 is applied between the gate line 7 and the leakage path 6,4,25. Thus, the short-circuit track 4,25 may be earthed when the high voltage pulse Vg2 is applied to the gate line 7. The main voltage drop is across the thin dielectric layer 8 between the gate line 7 and the channel regions 6 of the TFTs 45.

Figure 6:
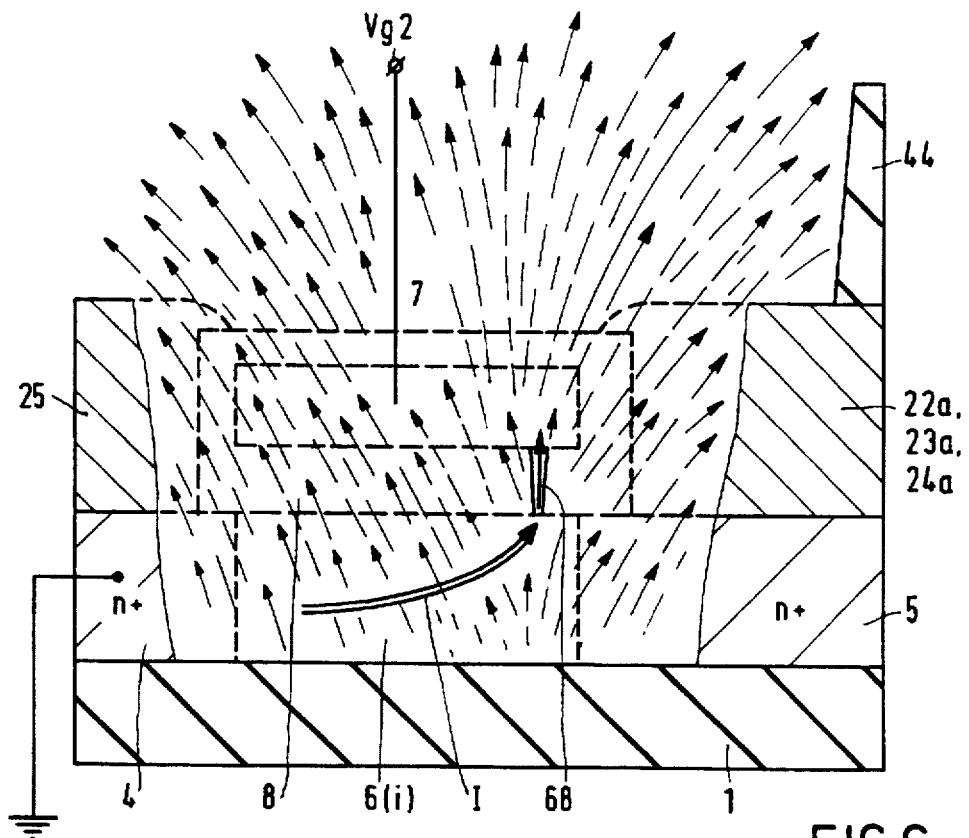

FIG. 6 illustrates how the blowing of TFT 45 is thought to occur. At the very high voltage Vg2, breakdown of the gate dielectric 8 can easily occur at local defects 68 (such as pin holes and damage sites) in the dielectric 8. Narrowing of the channel region 6 increases the electrical resistance of the path along which the breakdown current flows (shown as an electron flow I, from the earthed source 4). Very high current densities result from the constriction of the breakdown current I at the highly localised defect sites 68 in the dielectric 8. The resulting high density current flow I through site 68 to the gate line 7 and in the narrow channel region 6 of the TFT 45 results in excessive heating of the TFT structure. For example, temperatures in excess of at least 1,100° C. or 1,200° C. may be reached. As a result, vaporisation of the TFT structure occurs. The TFT structure 45 is blown completely away over a wide area, for example over the area of the window 42 in the protective layer 44 as illustrated in FIGS. 2, 3 and 6.

By this means, the individual tracks 22,13,14 etc are isolated from the short-circuit ring, and the device can be operated normally with individual signals at its contact pads 22a,23a,24a, etc.

FIGS. 7 to 9 illustrate various drain-current gate-voltage characteristics (Id, Vg) of gateable link transistors 45 useable in accordance with the present invention. The characteristics in FIGS. 7 and 8 are for n-channel TFTs in which current flow is by electrons in the channel region 6 under the control of the gate 7. FIGS. 2 and 6 illustrate such n-channel TFTs, having n+ source and drain regions 4 and 5. In the TFTs of FIGS. 2 and 6, the channel region 6 was not deliberately doped, e.g it is masked when implanting phosphorous or arsenic ions 30 in FIG. 5. Due to the high density of defect states in the semiconductor material of the thin film 3, the Fermi level is near the middle of the bandgap. Thus, the undoped channel region 6 behaves as though it has substantially intrinsic conductivity. In practice, depending on the particular annealing and/or crystallisation and/or deposition technology used to provide a polycrystalline silicon film 3, it is found that the Fermi level may be shifted slightly from the centre of the bandgap towards the conduction band in most cases, so that the undoped polycrystalline silicon channel region 6 may have a very low n type conductivity, still with a high impedance. This situation is illustrated by curves VII-A in FIGS. 7 and 8.

In FIGS. 7 and 8, the ordinate of the graph is the drain current Id which flows through the TFT 45 when a gate voltage Vg is applied. FIG. 8 is a plot based on a measured characteristic for a TFT 45 having a channel width w of 4 μm and a channel length of 12 μm. The applied drain voltage was 5 volts. In FIG. 8, Id is in amperes, and the abscissa Vg/t is in volts per μm, of which Vg is the gate voltage in volts and t is the thickness of the silicon oxide gate dielectric 8 in μm. Thus, $-50V \cdot \mu m^{-1}$ on the abscissa of FIG. 8 corresponds to a gate voltage Vg of −2.5 volts with a gate dielectric thickness t of 0.05 μm. With a gate dielectric thickness t of 0.15 μm (i.e the unthinned film 18 as used for the gate dielectric of the circuit TFTs 41), the equivalent values are $-16.7V \cdot \mu m^{-1}$ for Vg of −2.5 volts and $-50V \cdot \mu m^{-1}$ for Vg of −7.5 volts. The low voltage Vg1 for turning off the TFT 45 (for circuit testing) and the very high voltage Vg2 for blowing the TFT 45 are now discussed with reference to these characteristics of FIGS. 7 and 8.

The magnitude of the voltage Vg1 depends on the threshold voltage of the TFT 45. The threshold voltage is a function of the thickness of the gate dielectric 8 and can be changed for a given TFT structure by modifying the doping level (if any) in the channel region 6 of the TFT. The magnitude of the voltage Vg2 depends inter alia on the thickness of the gate dielectric 8 of the TFT 45. In a typical case such as FIG. 8, Vg1 may be about −2 volts, and Vg2 may be about 50 volts or more volts, i.e Vg2 may be one or more orders of magnitude higher than Vg1. Vg of 50 volts with a gate dielectric thickness t of 0.05 μm gives an abscissa value of $10^3 V \cdot \mu m^{-1}$, which is off the abscissa scale in FIG. 8. For this reason, curve VII-A of FIG. 7 represents the curve of FIG. 8 in a diagrammatic form also illustrating Vg2 of about 50 volts or more. This voltage Vg2 is outside the normal transistor operation range of the TFT 45 and causes instant breakdown of the transistor structure, preferably by breakdown of the gate dielectric 8. This excessive gate bias Vg2 may be applied as a single pulse of constant high voltage, for example for a pulse duration of the order of milliseconds. To prevent overshoots such as may occur with the abrupt application of a stepped 0–50 volt pulse, the voltage may be ramped up from 0 volts to 50 volts over a 0.1 to 0.2 millisecond duration and then be held at 50 volts or more for several milliseconds. Instead of applying a constant voltage pulse, a constant current may be applied.

FIG. 8 and curve VII-A of FIG. 7 illustrate the characteristic for a TFT 45 having no deliberate doping of its channel region 6. Such a TFT 45 has very little conductance along its channel region 6 in the absence of a significant level of gate bias voltage Vg. FIG. 8 shows an Id of between $10^{-11}$ and $10^{-12}$ amps at Vg=0.

Some degree of channel conductance at Vg=0 is advantageous for ESD protection, because (1) the rate of charge leakage increases with channel conductance and (2) it is generally not desirable to apply a bias Vg to the gate line 7 to obtain such conductance during the ESD protection stage. However, very little (if any) channel conductance through the links 45 is desirable when testing the device circuit. Therefore, for the circuit testing operation it is desirable to operate with the TFT links 45 at or near the voltage minimum in FIGS. 7 and 8.

To turn hard off the specific TFT 45 of FIG. 8 a small negative gate voltage Vg1 is required (e.g about −2 volts). Alternatively, it is possible to shift the voltage minimum in this transistor characteristic closer to 0 volts (or even to positive voltages) by changing the threshold voltage of the TFT 45. This may be effected by modifying or charging the gate dielectric 8 (e.g by modifying its charge content) or by incorporating an acceptor concentration in the channel region 6 (e.g by doping the region 6 with boron). Such a shift of the characteristic (by boron doping) is illustrated in curve VII-B of FIG. 7. In this case, it is not necessary to apply a gate bias Vg1 to turn the links 45 hard off during the circuit testing. However, at Vg=0 in this VII-B situation, the channel region 6 may have too high an impedance value to leak away static charge at a sufficiently fast rate in some ESD protection situations.

Curve VII-C in FIG. 7 illustrates a further modification in which a donor concentration (for example, of phosphorous) has been incorporated in the channel region 6. The resulting change in gate threshold voltage changes the enhancement TFT 45 of curves VII-A and VII-B into a depletion TFT 45. As a result of this donor doping of the channel region 6, the channel conductance is of a moderately high level (moderately high Id at Vg=0) for ESD leakage. The rate of charge leakage is fast for ESD protection with no bias applied to the gate 7. However, a balance is needed, otherwise too high a value of Vg1C may be required to turn TFT 45 hard off during the circuit testing stage.

The same bias level Vg2 (e.g about 50 volts or more) may be used to blow all these TFTs 45 regardless of whether their characteristics are as in curve VII-A or VII-B or VII-C. Thus, depending on the ESD environment and the device circuit environment, the blowable gateable TFT links 45 may be an enhancement TFT having a characteristic such as curve VII-B or a depletion TFT having a characteristic such as curve VII-C. For many situations an optimum compromise balancing ESD leakage rate and gate bias Vg1 for circuit testing is that of curve VII-A, i.e an enhancement TFT 45 having some degree of conductance at Vg=0.

The thin-film circuitry of liquid-crystal displays and other large-area electronics devices is often formed of n-channel TFTs 41. Thus, it is comparatively easy to form n-channel TFT links 45 having the characteristics of VII-A, VII-B and/or VII-C in such devices. An increasing proportion of large-area electronics devices nowadays have thin-film circuitry formed of C-MOS (n-channel and p-channel) TFTs 41. In C-MOS devices in accordance with the invention, the blowable gateable links 45 may be n-channel TFTs as illustrated in FIGS. 2, 6, 7 and 8. Alternatively, the links 45 may be p-channel TFTs for which sample characteristics are illustrated in FIG. 9. In this case, the source and drain regions 4 and 5 of the TFT 45 are p-type conductivity (e.g with a boron doping). Characteristic IX-A is for such a p-channel TFT 45 whose polycrystalline silicon channel region 6 is not deliberately doped i.e region 6 has very light n-type conductance but is substantially intrinsic. Characteristic IX-B is for such a TFT 45 having boron doping in its channel region to shift its gate threshold voltage so as to locate the voltage minimum at about Vg=0. Curve IX-C illustrates the situation for such a p-channel TFT having donor (e.g phosphorous) doping in its channel region 6.

It will be evident that many other modifications are possible in accordance with the present invention, both with regard to the thin-film structures and their method of manufacture.

Although it is advantageous to provide one or more windows 42 in the protective layer 44, the applicants find that by appropriate design of the thin-film structure of the TFT 45 to give extremely high field intensities and heating intensities, such very high temperatures can be obtained that the TFT structure 45 will vaporise together with any overlying area of the protective layer 44, at least when layer 44 is of a polymer material.

In the device structure of FIG. 1, the gateable link TFTs 45 were provided between the ends of connection tracks 13,14,22, . . . and a peripheral short-circuit ring 4,25. The peripheral ring may comprise a metal track 25 on a semiconductor track 4. However, the peripheral ring may consist solely of a metal track 25 or solely of a highly doped semiconductor track. Gateable link TFTs 45 blowable in accordance with the present invention may also be incorporated at other locations in the thin-film circuitry of the electronic device.

FIG. 10 illustrates such a modification, in which the TFTs 45 are interleaved with the thin-film connection tracks 33,34,35,36. The tracks 33 to 36 may be of, for example, doped polycrystalline silicon. Other tracks (such as metal tracks 37,38) may form cross-overs with these tracks 33 to 36. The thin-film structure at the areas C and C' of FIG. 10 may be similar to that of section C of FIG. 2. Thus, a thick insulating layer provided by two films 18 and 28 may be present between the overlying conductor 37,38 and the underlying conductor tracks 33 to 36. In the arrangement illustrated in FIG. 10, the common gate line for the blowable TFTs 45 comprises the track 38 and individual gates 7. This common track 38 contacts the individual gates 7 of the TFTs 45 at windows in the insulating film 28. The thin-film structure of the TFTs 45 in FIG. 10 may be similar to that shown in section A in FIG. 2. Thus, the gate dielectric 8 of these TFTs 45 may be thinner than the gate dielectric 18 of the device circuit TFTs 41. The channel region 6 of the TFTs 45 may be narrowed in the vicinity of their gates 7, as illustrated in FIG. 10. A protective layer 44 may be provided over the device structure of FIG. 10. This protective layer 44 may have one or more windows 42 over the area of the gateable link TFTs 45.

It will be evident that many other modifications are possible within the scope of the present invention. FIGS. 2 to 6 illustrate co-planar non-inverted TFT structures. However, the TFTs 41 and 45 may be of the inverted type having their gate electrodes 7 and 17 and gate dielectrics 8 and 18 sandwiched between the substrate 1 and the semiconductor film 3. Furthermore, the source and drain electrodes 4,5,14,15 of the TFTs 41 and 45 need not be co-planar with the channel region 6 and 16. Thus, these source and drain regions may be formed by highly doped semiconductor films deposited on (or below) the intrinsic semiconductor film 3 which provides the channel regions 6 and 16.

FIG. 11 illustrates such a modification of the gateable link TFT 45. This TFT 45 is of the so-called "inverted staggered" type. Its channel region 6 is located over its gate 7 and gate dielectric 8. When a high gate bias voltage Vg2 is applied to its gate 7, at least the upper part of the TFT (including its channel region 6) evaporates to form an open-circuit in the charge-leakage path 6,4,25.

As described above, the semiconductor film from which the channel regions 6 are formed may be of polycrystalline silicon which often has a light n type conductance without deliberate doping. However, the device circuitry in some large-area devices in accordance with the present invention may comprise TFTs 41 and/or thin-film diodes comprising amorphous silicon. The blowable gateable link TFTs 45 provided in accordance with the present invention may comprise channel regions 6 formed from an amorphous silicon film.

From reading the present disclosure, other variations and modifications will be apparent to persons skilled in the art. Such variations and modifications may involve equivalent and other features which are already known in the design, manufacture and use of electronic devices comprising thin-film circuits and component parts thereof and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The Applicants hereby give notice that new claims may be formulated to such features and/or combinations of such features during the prosecution of the present application or of any further application derived therefrom.

I claim:

1. An electronic device having on an insulating substrate a plurality of thin-film circuit elements including a group of thin-film connection tracks, a group of thin-film transistors on the substrate in such an arrangement with the thin-film circuit elements that a channel region of a respective transistor provides a gateable link to a respective thin-film track of the group of tracks for connecting that thin-film track in a charge leakage path, which leakage path serves for protecting the circuit elements against a damaging electrostatic discharge, the group of transistors having a common gate line for applying a gate bias voltage to control current flow through the channel regions of the transistors, which device is characterised in that each thin-film transistor of the group is constructed, in the area of its channel region and the common gate line, with a thin-film structure suitable for rendering the transistor open-circuit by evaporation of its channel region by the application of a sufficiently high gate bias to the common gate line, wherein the thin-film structure comprises, for the transistors of the gateable links, a gate dielectric which has a smaller thickness than a thicker insulating thin-film pattern which provides a gate dielectric of other transistors in a circuit of the device.

2. An electronic device having on an insulating substrate a plurality of thin-film circuit elements including a group of thin-film connection tracks, a group of thin-film transistors on the substrate in such an arrangement with the thin-film circuit elements that a channel region of a respective transistor provides a gateable link to a respective thin-film track of the group of tracks for connecting that thin-film track in a charge leakage path, which leakage path serves for protecting the circuit elements against a damaging electrostatic discharge, the group of transistors having a common gate line for applying a gate bias voltage to control current flow through the channel regions of the transistors, which device is characterised in that each thin-film transistor of the group is constructed, in the area of its channel region and the common gate line, with a thin-film structure suitable for rendering the transistor open-circuit by evaporation of its channel region by the application of a sufficiently high gate bias to the common gate line, wherein the thin-film structure comprises a semiconductor thin film pattern providing the channel region and having a width which is narrowed in the vicinity of the common gate line.

3. An electronic device having on an insulating substrate a plurality of thin-film circuit elements including a group of thin-film connection tracks, a group of thin-film transistors on the substrate in such an arrangement with the thin-film circuit elements that a channel region of a respective transistor provides a gateable link to a respective thin-film track of the group of tracks for connecting that thin-film track in a charge leakage path, which leakage path serves for protecting the circuit elements against a damaging electrostatic discharge, the group of transistors having a common gate line for applying a gate bias voltage to control current flow through the channel regions of the transistors, which device is characterised in that each thin-film transistor of the group is constructed, in the area of its channel region and the common gate line, with a thin-film structure suitable for rendering the transistor open-circuit by evaporation of its channel region by the application of a sufficiently high gate bias to the common gate line, wherein the thin-film structure comprises windows in a protective layer which is present over the thin-film circuit elements and thin-film connection tracks, the windows expose the thin-film structure of the transistors at the area of their channel regions, and the protective layer serves to mask the thin-film circuit elements and thin-film connection tracks against any debris from gateable links when so broken.

4. A method of manufacturing an electronic device having on an insulating substrate a plurality of thin-film circuit elements including a group of thin-film connection tracks, which method includes forming a group of thin-film transistors on the substrate in such an arrangement with the thin-film circuit elements that a channel region of a respective transistor provides a gateable link to a respective thin-film track of the group of tracks for connecting that thin-film track in a charge leakage path, which leakage path serves for protecting the circuit elements against a damaging electrostatic discharge, the group of transistors being provided with a common gate line for applying a gate bias voltage to control current flow through the channel regions of the transistors, which method is characterised in that, after the leakage path has served for electrostatic discharge protection, the gateable links in the leakage path to all the thin-film tracks of the group are broken simultaneously by applying a sufficiently high gate bias to the common gate line to break the links by evaporating at least the channel regions of the transistors.

5. A method as claimed in claim 4, further characterised in that the channel region of the transistor is provided by a semiconductor thin film pattern having a width which is narrowed in the vicinity of the common gate line.

6. A method as claimed in claim 5, further characterized in that the thin-film circuit elements of the device include transistors in a device circuit, and the transistors of the gateable links are formed by using at least some of the thin-film processing steps as used in forming the transistors of the device circuit.

7. A method as claimed claim 6, further characterised in that a gate dielectric of the transistors of the gateable links is provided by a thin insulating thin-film pattern which has a smaller thickness than a thicker insulating thin-film pattern which provides a gate dielectric of the transistors in the device circuit.

8. A method as claimed in claim 7, further characterised in that the gate dielectrics for transistors in the device circuit and in the gateable links are formed by steps which include: depositing an insulating film where the device circuit and gateable links are to be formed; forming on the deposited insulating film a masking pattern having windows over where the gateable links are being formed; and etching the deposited insulating film to the smaller thickness at the windows.

9. A method as claimed in claim 6, further characterised in that channel regions of transistors in the device circuit and in the gateable links are formed from a common semiconductor thin-film pattern in which the channel regions of the transistors in the device circuit are given a width which is wider than a narrow width of the channel regions of the transistors in the gateable links.

10. A method as claimed in claim 4, further characterised in that, before applying the high gate bias to the common gate line, a protective layer is formed over the thin-film circuit elements and thin-film connection tracks to mask the thin-film circuit elements and thin-film connection tracks against any debris from gateable links when so broken, the protective layer having windows which expose the thin-film structure of the gateable-link transistors at the area of their channel regions.

11. A method as claimed in claim 4, further characterised in that the thin-film transistors of the gateable links are interleaved with the thin-film connection tracks to form the leakage path extending transverse to the longitudinal direction of the thin-film connection tracks, and in that the common gate line extends transverse to the longitudinal direction of the thin-film connection tracks and is insulated from these thin-film connection tracks by an insulating thin-film pattern which has a larger thickness than an insulating thin-film pattern which provides a gate dielectric of the transistors of the gateable links.

12. A method as claimed in claim 4, further characterized in that the thin-film circuit elements of the device include transistors in a drive circuit, and the transistors of the gateable links are formed by using at least some of the thin-film processing steps as used in forming the transistors of the device circuit.

* * * * *